United States Patent
Lecoq

(10) Patent No.: US 12,148,503 B2
(45) Date of Patent: Nov. 19, 2024

(54) INTEGRATED CIRCUIT COMPRISING A NON-VOLATILE MEMORY

(71) Applicant: STMicroelectronics (Grenoble 2) SAS, Grenoble (FR)

(72) Inventor: Xavier Lecoq, Voiron (FR)

(73) Assignee: STMICROELECTRONICS (GRAND OUEST) SAS, Le Mans (FR)

( * ) Notice: Subject to any disclaimer, the term of this patent is extended or adjusted under 35 U.S.C. 154(b) by 203 days.

(21) Appl. No.: 17/932,694

(22) Filed: Sep. 16, 2022

(65) Prior Publication Data

US 2023/0100872 A1    Mar. 30, 2023

(30) Foreign Application Priority Data

Sep. 29, 2021   (FR) ...................................... 2110247

(51) Int. Cl.
  *G11C 7/06*    (2006.01)
  *G11C 7/04*    (2006.01)
  *G11C 7/10*    (2006.01)

(52) U.S. Cl.
  CPC .............. *G11C 7/067* (2013.01); *G11C 7/04* (2013.01); *G11C 7/1069* (2013.01)

(58) Field of Classification Search
  CPC ......... G11C 7/067; G11C 7/04; G11C 7/1069; G11C 7/08; G11C 11/5642; G11C 16/24; G11C 16/26; G11C 29/026; G11C 29/021
  USPC .................................................. 365/185.21
  See application file for complete search history.

(56) References Cited

U.S. PATENT DOCUMENTS

| | | | |
|---|---|---|---|
| 2003/0153987 A1* | 8/2003 | Kano | G01D 9/005 700/11 |
| 2005/0024974 A1* | 2/2005 | Noguchi | G11C 29/52 714/E11.034 |
| 2005/0201148 A1 | 9/2005 | Chen et al. | |
| 2006/0250853 A1 | 11/2006 | Taylor et al. | |
| 2012/0063195 A1 | 3/2012 | Lam et al. | |
| 2013/0223155 A1 | 8/2013 | Oowada et al. | |

(Continued)

FOREIGN PATENT DOCUMENTS

WO    0025318 A1    5/2000

*Primary Examiner* — Huan Hoang
*Assistant Examiner* — Minh Dinh
(74) *Attorney, Agent, or Firm* — Slater Matsil, LLP

(57) ABSTRACT

In an embodiment an integrated circuit includes a non-volatile memory having a plurality of memory cells, wherein each memory cell is configured to store information, and wherein each memory cell is configured to provide a reading current having an intensity dependent on a value stored in the memory cell when the memory cell is selected for reading; and a sense amplifier including a first amplifier configured to amplify the reading current of each memory cell selected for reading, an oscillation generator configured to generate on basis of the amplified signal a signal having oscillations according to a frequency dependent on the intensity of the current of the amplified signal, a counter configured to count the oscillations of the signal generated by the oscillation generator over at least one given period of time and a digital processing circuit configured to determine a value represented by the amplified signal on basis of the value counted during the at least one given period of time using a lookup table between values countable by the counter and values representable by the amplified signal.

19 Claims, 3 Drawing Sheets

(56) References Cited

U.S. PATENT DOCUMENTS

2019/0287603 A1\* 9/2019 Antonyan ............... G11C 7/227
2020/0119028 A1    4/2020 Tran et al.
2020/0412993 A1\* 12/2020 Kawazu ................. H04N 23/80

\* cited by examiner

[Fig 1]
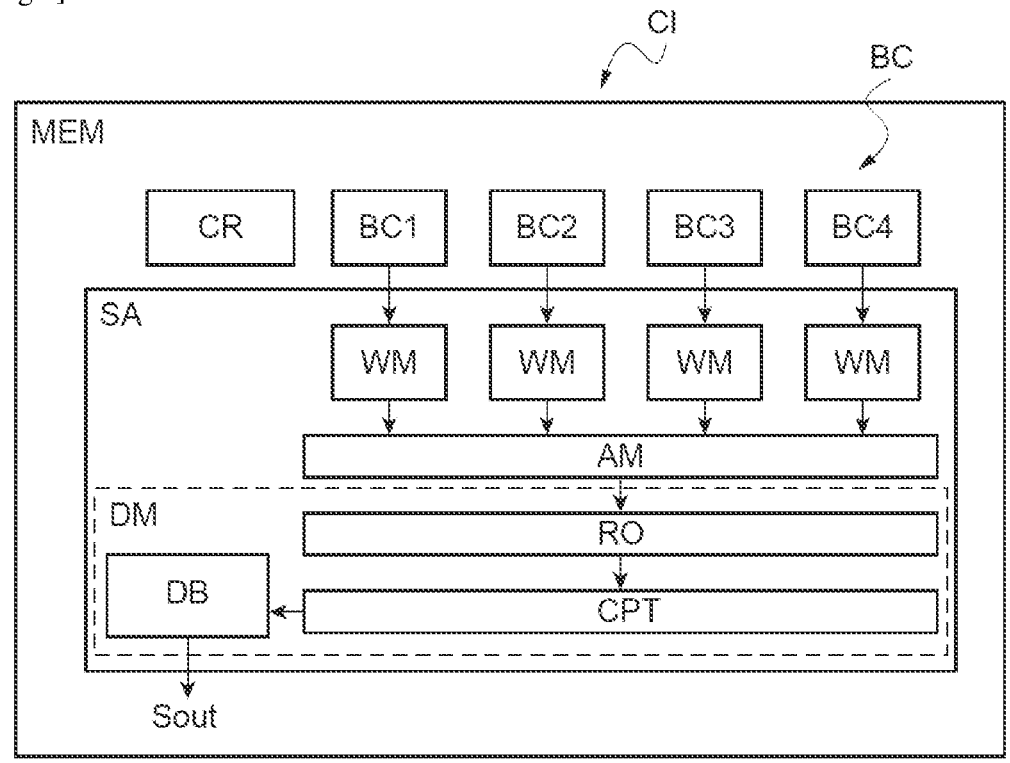
[Fig 2]
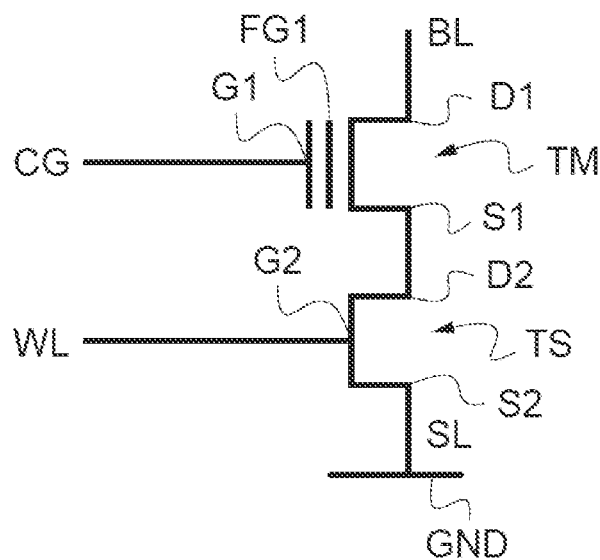

[Fig 3]
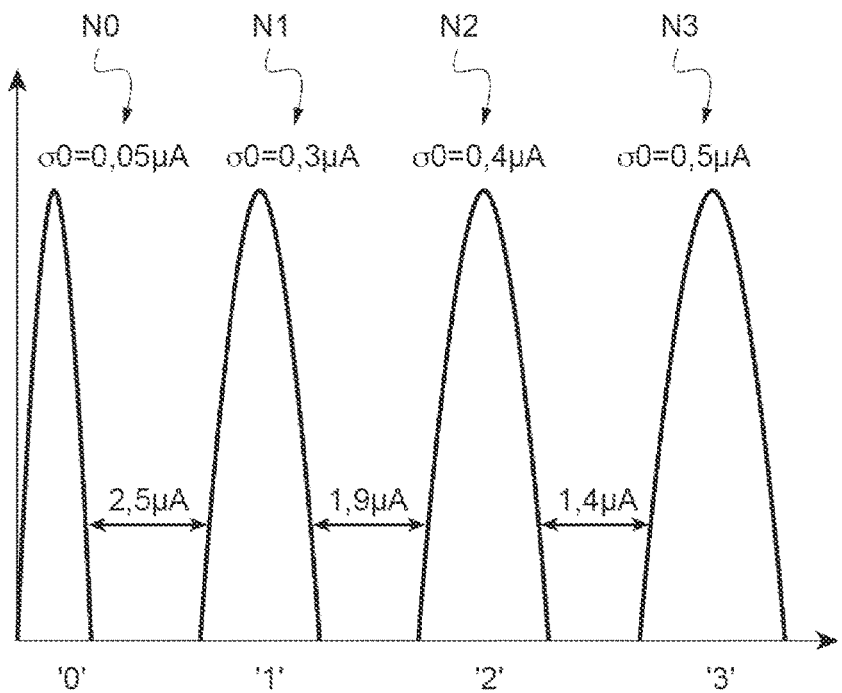
[Fig 4]
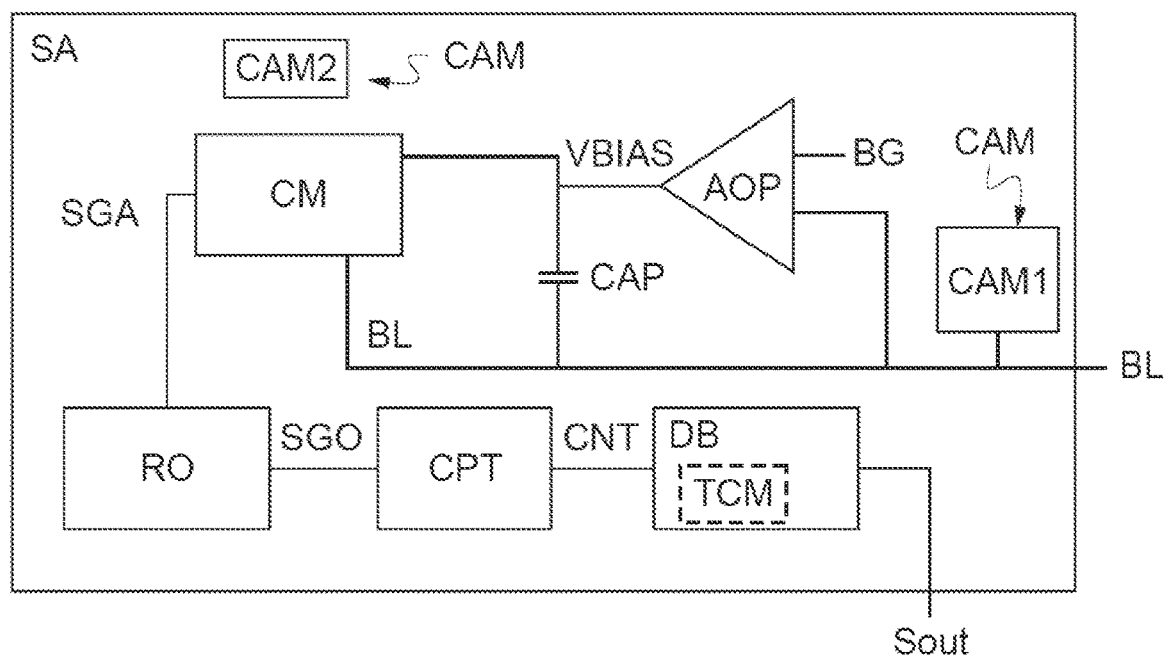

[Fig 5]
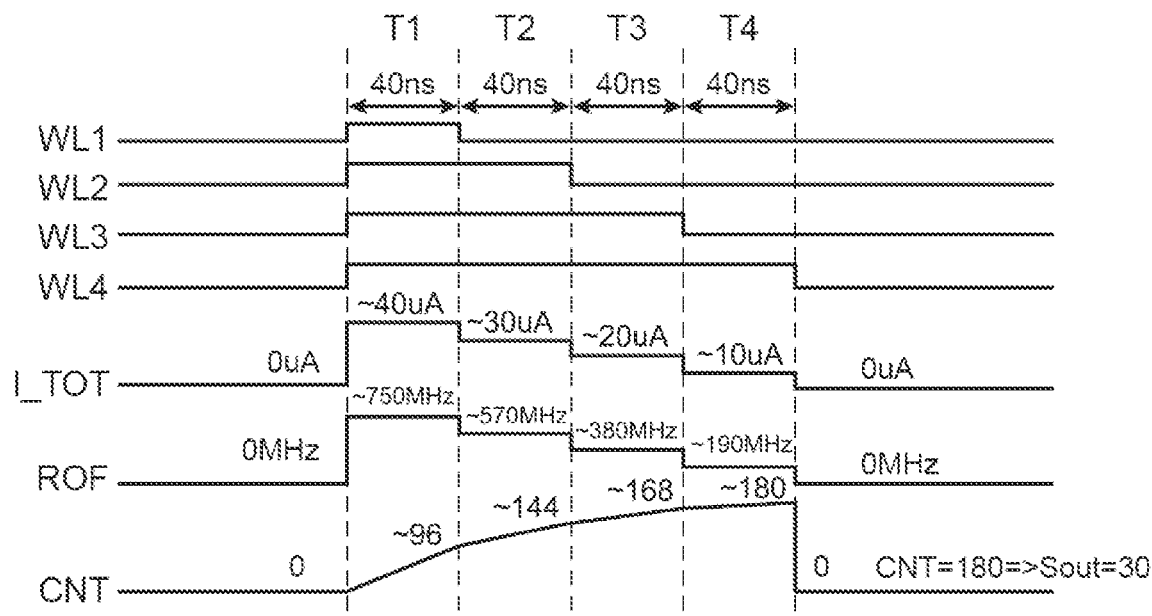

INTEGRATED CIRCUIT COMPRISING A NON-VOLATILE MEMORY

CROSS-REFERENCE TO RELATED APPLICATIONS

This application claims the benefit of French Application No. 2110247, filed on Sep. 29, 2021, which application is hereby incorporated herein by reference.

TECHNICAL FIELD

Implementations and embodiments relate to integrated circuits, and more particularly those including a non-volatile memory.

BACKGROUND

Non-volatile memories are used to store information. In particular, the conventional non-volatile memories comprise a plurality of memory cells. A memory cell constitutes a basic block of the memory. In particular, a memory cell is an electronic circuit configured to conventionally store a piece of binary information called bit, that is to say a piece of information that can be encoded on two levels so that this piece of information can have a value of "0" or "1". The memory cells of a memory are arranged in columns and in rows.

More particularly, a memory cell can comprise a memorisation transistor having a floating gate configured to store electric charges corresponding to a piece of binary information.

SUMMARY

In order to read a piece of information recorded in a memory cell, each column of memory cells is provided with a sense amplifier. This amplifier is used to detect and amplify low-power signals representative of the bits stored in the memory cells of the column. These signals are amplified to a level allowing their use by circuits outside of the memory.

Some non-volatile memories are capable of storing information on more than two levels. These memories thus comprise multi-level cells. In other words, such a memory cell is configured to store a piece of information that can take on more than two values, and not only "0" or "1". In particular, each memory cell is adapted to store more than one bit of information by discriminating the number of charges that can be stored on a floating gate of the storage transistor. For example, a memory cell can allow to store four levels of information thus corresponding to two bits. The use of multi-level memory cells allows to reduce the dimensions of the memory and its manufacturing cost. Nevertheless, the known solutions do not allow to ensure sufficiently reliable reading of the information stored in memory.

Moreover, the memory cells with several levels are generally sensitive to variations in temperature and to the variations in embodiments of the memory. These sensitivities to variations in temperature and to the variations in embodiments of the memory can lead to errors in the reading of the information stored in memory, so that the reliability of such memory cells is even further reduced.

Furthermore, the data stored in memory is generally processed by a processor. This processor is thus configured to carry out calculations by handling this data. Nevertheless, this involves a relatively long time of processing of the data.

In order to reduce the time of processing of the data, some non-volatile memories are adapted to directly carry out calculations on their memorized data (this method is also known by the expression "in-memory computing"). The execution of the calculations directly in the memory allows to avoid losing time for the transfer of the data between the memory and the processor. Such non-volatile memories are particularly advantageous for certain uses, like the execution of artificial neural networks. However, such memories are generally complicated to manufacture.

SUMMARY

Embodiments provide a simple non-volatile memory allowing to store in the same memory cell information that can take on more than two values.

According to one embodiment, an integrated circuit is proposed including a non-volatile memory comprising:
 a plurality of memory cells, each memory cell is configured to store a piece of information that can take on more than two values, each memory cell being configured to circulate a reading current having an intensity dependent on the value stored in the memory cell when this memory cell is selected for reading,
 a sense amplifier including:
  an amplifier configured to amplify the reading current of each memory cell selected for reading,
  determination means comprising:
  an oscillation generator configured to generate on the basis of the amplified signal a signal having oscillations according to a frequency dependent on the intensity of the current of the amplified signal,
  a counter configured to count the oscillations of the signal generated by the oscillation generator over at least one given period of time,
  a digital processing circuit configured to determine a value represented by the amplified signal on the basis of the value counted during said at least one given period of time using a lookup table between values that can be counted by the counter and values that can represent the amplified signal.

Each memory cell of the memory is thus a multi-level cell allowing to densify the memory.

The determination means of the sense amplifier allow to determine in a simple and reliable manner the value stored in the memory cell.

In one embodiment the sense amplifier is configured to add values of information stored in several memory cells by selecting for reading these various memory cells and by summing the reading currents delivered by these selected memory cells before delivering the summed current to the amplifier of the sense amplifier.

Thus, the amplified summed current is transmitted to the oscillation generator. The number of oscillations counted by the counter is thus proportional to the sum of the values of the information of the memory cells selected for reading.

Thus, the memory is adapted to carry out directly inside it additions between values of information stored in several memory cells in a simple and rapid manner. In particular, the additions can thus be carried out directly in the memory and not by a processor. This allows to not lose time to transmit the values to be added to a processor from the memory.

In a further embodiment, the sense amplifier is configured to apply a weight to a value of a piece of information stored in a memory cell by selecting this cell for reading during several given periods of time.

The weight applied to the value of the piece of information stored in the memory cell thus corresponds to the number of given periods of time during which the memory cell is selected for reading.

Thus, the memory is adapted to carry out directly inside it weightings of a value of a piece of information stored in a memory cell in a simple and rapid manner. In particular, the weightings can thus be carried out directly in the memory and not by a processor. This allows to not lose time to transmit the values to be weighted to the processor from the memory.

In another embodiment, the sense amplifier further comprises means for compensating for temperature including a temperature sensor configured to measure a temperature of the memory, the means for compensating for temperature being configured to adapt a control of the memory cells so as to adapt the reading current generated by the memory cell according to a temperature measured by the temperature sensor.

The means for compensating for temperature allow to reduce, or even to eliminate, errors in the determination of the value corresponding to the amplified signal that can result from variations in temperature of the memory.

In yet another embodiment, the sense amplifier further comprises calibration means configured to:
- define a base current at the input of the sense amplifier when no memory cell is selected so as to define a desired minimum value that can be counted by the counter, and
- adapt a gain of the amplifier to obtain a desired maximum value that can be counted by the counter.

Thus, the calibration means allow to automatically calibrate the sense amplifier so as to reduce, or even eliminate, the errors in the determination of the value corresponding to the amplified signal that can result from variations in the implementation of the memory.

In various embodiments the counter is eight-bit.

IN BRIEF DESCRIPTION OF THE DRAWINGS

Other advantages and features of the invention will appear upon examining the detailed description of embodiments and implementations, in no way limiting, and the appended drawings in which:

FIG. 1 illustrates an integrated circuit according to embodiments;

FIG. 2 shows a memory cell BC according to embodiments;

FIG. 3 illustrates a distribution of reading currents according to embodiments;

FIG. 4 illustrates a sense amplifier SA according to embodiments; and

FIG. 5 illustrates a timing diagram according to embodiments.

DETAILED DESCRIPTION OF ILLUSTRATIVE EMBODIMENTS

FIG. 1 illustrates an integrated circuit CI according to embodiments.

The integrated circuit CI comprises a memory MEM including several memory cells BC. Each memory cell BC is a multi-level cell. Each memory cell is thus configured to store a piece of information on more than two levels. Thus, the piece of information stored in a memory cell can take on more than two values.

Each memory cell BC comprises an output configured to deliver an electric signal having an intensity representative of the value stored by this memory cell BC.

As illustrated in FIG. 2, a memory cell BC can comprise a memorisation transistor TM and a selection transistor TS. The memorisation transistor TM is configured to be able to store a piece of information on more than two levels.

In particular, the memorisation transistor TM comprises a source S1 connected to a drain D2 of the selection transistor TS. The memorisation transistor TM comprises a drain D1 forming an output of the memory cell BC. This output is connected to a bit line BL.

The memorisation transistor TM further comprises a gate G1 and a floating gate FG1. The gate G1 is configured to receive a signal CG allowing to control the gate G1 of the memorisation transistor in order to carry out a writing of a piece of information in the memorisation transistor TM or a reading of a piece of information stored by the memorisation transistor TM.

In particular, the floating gate FG1 is configured to store electric charges according to the current applied to the gate G1. The quantity of electric charges stored corresponds to a piece of information stored by the memorisation transistor TM. The memorisation transistor TM is configured to store various quantities of electric charges. A reading current is generated when a reading of a piece of information stored in the memorisation transistor is carried out. This reading current depends on the quantity of electric charges stored by the floating gate FG1.

For example, FIG. 3 illustrates a distribution of the reading currents corresponding to a piece of information that can take on four values. Thus, a first level N0 of reading current having a standard deviation $\sigma 0$ corresponds to a value "0", a second level N1 of reading current having a standard deviation $\sigma 1$ corresponds to a value "1", a third level N2 of reading current having a standard deviation $\sigma 2$ corresponds to a value "2" and a fourth level N3 of reading current having a standard deviation $\sigma 3$ corresponds to a value "3". The value of the piece of information stored by the memorisation transistor TM can thus be represented over two bits.

The selection transistor TS comprises a source S2 connected to a source line SL connected to a cold point, in particular to a ground GND. The selection transistor TS comprises a gate G2 configured to receive a signal WL. The signal WL allows to select the memory cell BC for a reading or a writing of a piece of information in the memorisation transistor TM.

The memory cells BC of the memory can be separated into various groups. For example, a group of four memory cells BC1, BC2, BC3 and BC4 is shown in FIG. 1.

The memory MEM further comprises for each group of memory cells BC a sense amplifier SA. This sense amplifier SA is adapted to read the information stored in the memory cells of the same group. The sense amplifier SA is also adapted to carry out calculations on the information stored in the memory cells of the same group.

In particular, the sense amplifier SA is connected to the output of each memory cell BC so as to be able to receive electric currents representative of the piece of information stored in the memory cells BC.

The sense amplifier SA comprises weighting means WM allowing to apply a weight to the information stored in memory.

The sense amplifier SA also comprises addition means AM allowing to add the information, weighted or not.

The sense amplifier SA also comprises detection means DM configured to determine the value, weighted or not, of the information stored in the memory cells BC or to determine the value calculated by the addition means AM on the basis of the values of the information stored in the memory cells BC. The value determined by the detection means DM is thus indicated in the digital signal Sout.

The detection means DM comprise in particular an oscillation generator RO ("ring oscillator"), a counter CPT and a digital processing circuit DB. These detection means DM are described in detail below.

The memory also provides reference currents CR. These reference currents are used by means for compensating for temperature TCM and by calibration means CAM described below.

FIG. 4 illustrates an implementation of a sense amplifier SA. The sense amplifier SA has an input connected to a bit line BL configured to receive reading currents coming from memory cells of the same group that are connected to this bit line BL.

The signal on the bit line BL thus has an intensity equal to the sum of the intensity of the reading currents coming from the memory cells BC selected for reading. Thus, since the intensity of a reading current coming from a memory cell depends on the value of the piece of information stored in this memory cell, the intensity of the signal on the bit line BL depends on the sum of the values stored in the memory cells BC selected.

In particular, the sense amplifier SA comprises an operational amplifier AOP configured to polarise the bit line BL so as to obtain a reading current that circulates in the memory cells BC that is readable by the sense amplifier SA. The operational amplifier AOP is configured to receive the signal of the bit line BL and a signal BG and to deliver a signal VBIAS allowing to polarise the bit line via a capacitive element CAP. The signal VBIAS is generated on the basis of the signal BG used to polarise the bit line BL.

The sense amplifier SA further comprises an amplifier CM allowing to amplify the signal on the bit line BL. The amplifier CM can be a current mirror. The amplifier CM has an input connected to the bit line BL so as to receive the signal circulating on the bit line BL. The amplifier CM also has an input configured to receive the signal VBIAS generated by the operational amplifier AOP to activate the sense amplifier SA.

The amplifier CM also has an output configured to deliver an amplified signal SGA on the basis of the signal circulating on the bit line BL. The amplifier CM allows to amplify the signal on the bit line BL in order for the later to have an amplitude sufficient for the operation of the oscillation generator RO.

In particular, the oscillation generator RO comprises an input configured to receive the amplified signal SGA delivered by the amplifier CM. The oscillation generator RO also has an output configured to deliver an output signal SGO having a regular succession of oscillations, in particular of bursts. The frequency of the oscillations in the output signal depends on the intensity of the amplified signal received at the input of the oscillation generator. In particular, the greater the intensity of the amplified signal SGA, the higher the frequency of the oscillations in the output signal SGO. The frequency of the oscillations thus directly depends on the intensity of the currents delivered by the memory cells BC selected for reading.

The counter CPT comprises an input configured to receive the signal SGO delivered at the output of the oscillation generator RO. The counter CPT is configured to count the number CNT of oscillations in the signal SGO during at least one given period of time. Thus, the higher the frequency of the oscillations in the signal SGO, the greater the counted value CNT of the counter over said period of time. The relationship between the counted values CNT and the current on the bit line BL is thus a linear transfer function.

Preferably, the counter CPT is 8-bit.

The digital processing circuit DB is configured to determine a value corresponding to the signal on the bit line BL according to the value CNT counted by the counter CPT.

In particular, the digital processing circuit DB can use a lookup table that matches values CNT that can be counted by the counter to values representative of the sum of the values stored in the memory cells BC selected for reading.

Thus, the memory can simply determine the value of the information stored in the memory cells.

Moreover, the sense amplifier SA is configured to apply a weight to the values of the information stored in the memory cells BC. The application of a weight to these values is carried out by modifying the selection of the memory cells BC over time. In particular, the weight applied to a value stored in a memory cell BC corresponds to the number of periods of time during which this memory cell BC is selected. The weight to apply to a value of a piece of information stored in a memory cell BC is thus defined simply, by controlling a selection time of this memory cell BC.

Moreover, the digital processing circuit DB is also configured to carry out subtractions between the values of the information stored in the memory cells BC on the basis of a reading of the values forming a minuend of the subtraction and a reading of the values forming a subtrahend of the subtraction. In particular, the values forming a minuend of the subtraction are added during a first reading and the values forming a subtrahend of the subtraction are added during a second reading, before carrying out the subtraction using the digital processing circuit DB.

Thus, the memory MEM is configured to carry out calculations inside it in a simple and rapid manner. It is not therefore necessary to transmit the values of the information stored in the memory cells to a processor to carry out these calculations.

The sense amplifier SA further comprises means for compensating for temperature TCM configured to compensate for errors that can result from variations in temperature of the memory MEM. The means for compensating for temperature TCM can comprise a temperature sensor adapted to sense the temperature of the memory. The means for compensating for temperature TCM can also comprise a reference value stored in a memory cell BC of the memory, and allowing to deliver a reference current CR. When the sensor detects a variation in temperature, the digital processing circuit DB is thus configured to adapt the voltage of the signal delivered to the floating gate of the memorisation transistor according to a comparison between the value read on the basis of the memory cell BC storing the reference value and the reference value recorded.

The sense amplifier SA further comprises calibration means CAM configured to be able to automatically calibrate the sense amplifier SA. The calibration allows to compensate for variations in implementation of the memory. In particular, the calibration means CAM allow to calibrate the function of linear transfer between the values counter by the counter and the current on the bit line. The calibration means CAM are thus configured to adapt a ratio between the values counted by the counter and the current on the bit line. The calibration means CAM can be activated by the digital processing circuit. In particular, the calibration means CAM comprise a first circuit CAM1 configured to define a base current on the bit line when no memory cell BC is selected so as to define a desired minimum value that can be counted by the counter. The calibration means also comprise a second circuit CAM2 configured to adapt the gain of the amplifier to obtain a desired maximum value that can be counted by the counter when the current is high on the bit line (that is to say when all of the memory cells BC1, BC2, BC3 and BC4 are selected). The calibration carried out by the calibration means CAM can be carried out by using reference currents CR.

FIG. 5 illustrates an embodiment of the integrated circuit allowing to calculate a value Sout corresponding to the following formula:

$$Sout=W1*B1+W2*B2+W3*B3+W4*B4,$$

where B1, B2, B3 and B4 are the values stored respectively in the memory cells BC1, BC2, BC3, BC4, and where W1, W2, W3, W4 are weights to be applied respectively to the values B1, B2, B3 and B4.

Here, the values B1, B2, B3 and B4 are equal to three. The value W1 is equal to one, W2 is equal to two, W3 is equal to three and W4 is equal to four.

The signals WL1, WL2, WL3, WL4 represent respectively the signals for the selection of the memory cells BC1, BC2, BC3, BC4 for reading.

The curve I_TOT represents the intensity of the current received at the input of the oscillation generator RO. The curve ROF represents the frequency of the oscillation generator RO. The curve CNT represents the value counted by the counter CPT.

Since the value of the maximum weight is equal to four, the calculation of the value Sout is carried out over four periods of time T1 to T4. Each period of time is 40 nanoseconds.

During the first period of time T1, the memory cells BC1, BC2, BC3 and BC4 are all selected. The intensity of the current on the bit line is thus approximately 40 microamperes. The frequency of the signal at the output of the oscillation generator is thus 750 MHz. Thus, at the end of the first period of time, the value of the counter is equal to 96. This value corresponds to the value S1=B1+B2+B3+B4.

Then, during the second period of time T2, only the memory cells BC2, BC3 and BC4 are selected. The memory cell BC1 is therefore not selected. The intensity of the current on the bit line is thus approximately 30 microamperes. The frequency of the signal at the output of the oscillation generator is thus 570 MHz. Thus, at the end of the second period of time, the value of the counter is equal to 144. This value corresponds to the value S2=S1+B2+B3+B4=B1+2*B2+2*B3+2*B4.

Then, during the third period of time T3, only the memory cells BC3 and BC4 are selected. The memory cells BC1 and BC2 are not therefore selected. The intensity of the current on the bit line is thus approximately 20 microamperes. The frequency of the signal at the output of the oscillation generator is thus 380 MHz. Thus, at the end of the second period of time, the value of the counter is equal to 168. This value corresponds to the value S3=S2+B3+B4=B1+2*B2+3*B3+3*B4.

Finally, during the fourth period of time T4, only the memory cell BC4 is selected. The memory cells BC1, BC2 and BC3 are not therefore selected. The intensity of the current on the bit line is thus approximately 10 microamperes. The frequency of the signal at the output of the oscillation generator is thus 190 MHz. Thus, at the end of the second period of time, the value of the counter is equal to 18°. This value corresponds to the value Sout=S3+B4=B1+2*B2+3*B3+4*B4=30.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
    a non-volatile memory comprising:
        a plurality of memory cells,
            wherein each memory cell is configured to store information, and
            wherein each memory cell is configured to provide a reading current having an intensity dependent on a value stored in the memory cell when the memory cell is selected for reading; and
    a sense amplifier comprising:
        a first amplifier configured to amplify the reading current of each memory cell selected for reading;
        an oscillation generator configured to generate on basis of an amplified signal a signal having oscillations according to a frequency dependent on the intensity of the current of the amplified signal;
        a counter configured to count the oscillations of the signal generated by the oscillation generator over at least one given period of time; and
        a digital processing circuit configured to determine a value represented by the amplified signal on basis of the value counted during the at least one given period of time and based on a lookup table between values countable by the counter and values representable by the amplified signal.

2. The integrated circuit according to claim 1, wherein the sense amplifier is configured to provide values of the information stored in several memory cells by reading these selected memory cells and by summing up the reading currents provided by these selected memory cells before delivering the summed current to the first amplifier.

3. The integrated circuit according to claim 1, wherein the sense amplifier is configured to apply a weight to a value of the information stored in a memory cell by selecting this cell for reading the cell.

4. The integrated circuit according to claim 1, wherein the sense amplifier further comprises a temperature sensor configured to measure a temperature of the non-volatile memory, the temperature sensor being configured to adapt a control of the memory cells so as to adapt the reading current generated by a memory cell based on the temperature measured by the temperature sensor.

5. The integrated circuit according to claim 4, wherein the digital processing circuit comprises the temperature sensor.

6. The integrated circuit according to claim 4, wherein the digital processing circuit is configured to adapt a voltage signal to a floating gate of the memory cell, and wherein the voltage signal is adapted when the temperature sensor detects a variation in temperature based on a reference value.

7. The integrated circuit according to claim 1, wherein the sense amplifier further comprises a calibrator configured to:
    define a base current at an input of the sense amplifier when no memory cell is selected so as to define a desired minimum value that is countable by the counter; and adapt a gain of the amplifier to obtain a desired maximum value that is countable by the counter.

8. The integrated circuit according to claim 1, wherein the counter is eight-bit.

9. An integrated circuit comprising:
a non-volatile memory comprising:
a plurality of memory cells,
wherein each memory cell is configured to store information, and
wherein each memory cell is configured to provide a reading current having an intensity dependent on a value stored in the memory cell when the memory cell is selected for reading; and
a sense amplifier comprising:
an input configured to receive the reading current;
a first amplifier configured to amplify the reading current;
an oscillation generator configured to generate an oscillation generator signal having regular successive oscillations according to a frequency dependent on the intensity of the current of an amplified signal;
a counter configured to count a number of the regular successive oscillations of the oscillation generator signal over at least one given period of time and to provide a count value; and
a digital processing circuit configured to determine a value represented by the count value counted during the at least one given period of time and based on a lookup table of values countable by the counter and values representable by the count value.

10. The integrated circuit according to claim 9, wherein the sense amplifier further comprises an operational amplifier configured to:
receive the reading current at a first input of the operational amplifier;
receive a signal at a second input of the operational amplifier; and
provide a bias signal to the first amplifier at an output of the operational amplifier.

11. The integrated circuit according to claim 10, wherein the first input of the operational amplifier is directly connected to the input of the sense amplifier and the output of the operational amplifier is directly connected to the first amplifier, wherein the first amplifier is directly connected to the input of the sense amplifier, and wherein a capacitive element is directly connected to the output of the operational amplifier, to the first amplifier and to the input of the sense amplifier.

12. The integrated circuit according to claim 10, further comprising a bitline between the first amplifier and the input of the sense amplifier, wherein the operational amplifier is configured to provide the bias signal allowing to polarise the bitline via a capacitive element.

13. The integrated circuit according to claim 9, wherein the sense amplifier is configured to provide values of the information stored in several memory cells by reading these selected memory cells and by summing up the reading currents provided by these selected memory cells before delivering the summed up reading current to the first amplifier.

14. The integrated circuit according to claim 9, wherein the sense amplifier is configured to apply a weight to a value of the information stored in a memory cell by selecting this cell for reading the cell.

15. The integrated circuit according to claim 9, wherein the sense amplifier further comprises a temperature sensor configured to measure a temperature of the non-volatile memory, the temperature sensor being configured to adapt a control of the memory cells so as to adapt the reading current generated by a memory cell based on the temperature measured by the temperature sensor.

16. The integrated circuit according to claim 15, wherein the digital processing circuit comprises the temperature sensor.

17. The integrated circuit according to claim 15, wherein the digital processing circuit is configured to adapt a voltage signal to a floating gate of the memory cell, and wherein the voltage signal is adapted when the temperature sensor detects a variation in temperature based on a reference value.

18. The integrated circuit according to claim 9, wherein the sense amplifier further comprises a calibrator configured to:
define a base current at the input of the sense amplifier when no memory cell is selected so as to define a desired minimum value that is countable by the counter; and
adapt a gain of the amplifier to obtain a desired maximum value that is countable by the counter.

19. The integrated circuit according to claim 9, wherein the counter is eight-bit.

* * * * *